(12) United States Patent
Barnes

(10) Patent No.: US 6,362,991 B1
(45) Date of Patent: Mar. 26, 2002

(54) MISS DETECTOR

(75) Inventor: William Bryan Barnes, Bradley Stoke (GB)

(73) Assignee: STMicroelectronics Limited, Almondsbury Bristol (GB)

( * ) Notice: Subject to any disclaimer, the term of this patent is extended or adjusted under 35 U.S.C. 154(b) by 0 days.

(21) Appl. No.: 09/654,720

(22) Filed: Sep. 5, 2000

(30) Foreign Application Priority Data

Sep. 10, 1999 (GB) ................................. 9921492

(51) Int. Cl.⁷ .................................. G11C 15/00
(52) U.S. Cl. ...................... 365/49; 365/189.07
(58) Field of Search ................ 365/49, 189.07

(56) References Cited

U.S. PATENT DOCUMENTS 5,396,448 A  * 3/1995 Takayanagi et al. ......... 365/49
5,454,094 A    9/1995 Montove ..................... 395/435
5,999,434 A  * 12/1999 Yoneda et al. ................ 365/49

OTHER PUBLICATIONS

French Search Report from Application No. 9921492, filed Sep. 10, 1999.

Patent Abstracts of Japan, vol. 1995, No. 07, Aug. 31, 1995 & JP 07 105690 A (NEC Corp.) Apr. 21, 1995.

* cited by examiner

Primary Examiner—Huan Hoang
(74) Attorney, Agent, or Firm—Wolf, Greenfield & Sacks, P.C.; James H. Morris; Robert A. Skrivanek, Jr.

(57) ABSTRACT

A miss detector for a content addressable memory has plural input lines connected across points with the memory output lines. The detector input lines are disposed in pairs of true and false lines, and gating circuitry gates together the true and false pairs to provide a miss error message.

14 Claims, 2 Drawing Sheets

MISS DETECTOR

FIELD OF THE INVENTION

The present invention relates to a miss detector for a content addressable memory.

BACKGROUND OF THE INVENTION

Content addressable memories find wide application for example in cache memories.

In operation, address information, which may truncated, can be stored in the CAM. At a later stage, information is applied to the CAM and where a match occurs between the applied information and the stored information a so-called "hit" occurs defined by a logic 1 occurring on an output line from the CAM corresponding to the bit position at which the hit occurred.

Where there is no match, no hit occurs, and positive indication of this situation is required.

SUMMARY OF THE INVENTION

According to a first aspect of the present invention there is provided a miss detector for a CAM having m output lines, said detector having n pairs of input terminals, wherein the binary equivalent of m has n digits, each input pair comprising a true input terminal and a false input terminal, circuitry connecting each output line either to a true or a false input terminal of every pair, and gating circuitry coupled to each pair, said gating circuitry having an output indicative of a miss on said output lines of said CAM.

According to a second aspect of the present invention there is provided a miss detector for a CAM having m output lines numbered 0 to (m−1), the detector having n pairs of input terminals, each pair comprising a true and a false input terminal, each pair corresponding to a bit position in the binary equivalent of m, connecting circuitry connecting each output line to a true or false input terminal of each pair of input terminals in conformity with the binary equivalent of the number of said output lines, index circuitry coupled to the true input terminals of each pair and having an index output corresponding to the binary equivalent of an output line when a hit occurs on said output line, and gating circuitry having inputs coupled to each pair, said gating circuitry having an output indicative of a miss.

Preferably said gating circuitry comprises a two-input OR gate connected to each pair of input terminals.

Advantageously said gating circuitry further comprises an n-input output OR gate having an input from each OR gate output.

Conveniently said connecting circuitry comprises a respective pull-up device connected to each input terminal and a pull-down device connected to each input terminal wherein said pull-down device has a control terminal connected to said CAM output lines.

Advantageously said connecting circuitry further comprises a respective inverter connected between said pull-up/pull-down devices and said input terminals.

Preferably said pull-up device comprises a p FET connected to conduct and said pull-down device comprises plural n FETs, each n FET having a gate connected to a CAM output line.

BRIEF DESCRIPTION OF THE DRAWINGS

Embodiments of the invention will now be described, by way of example only, with reference to the accompanying drawings in which.

DESCRIPTION OF THE PREFERRED EMBODIMENTS

Figure 1:
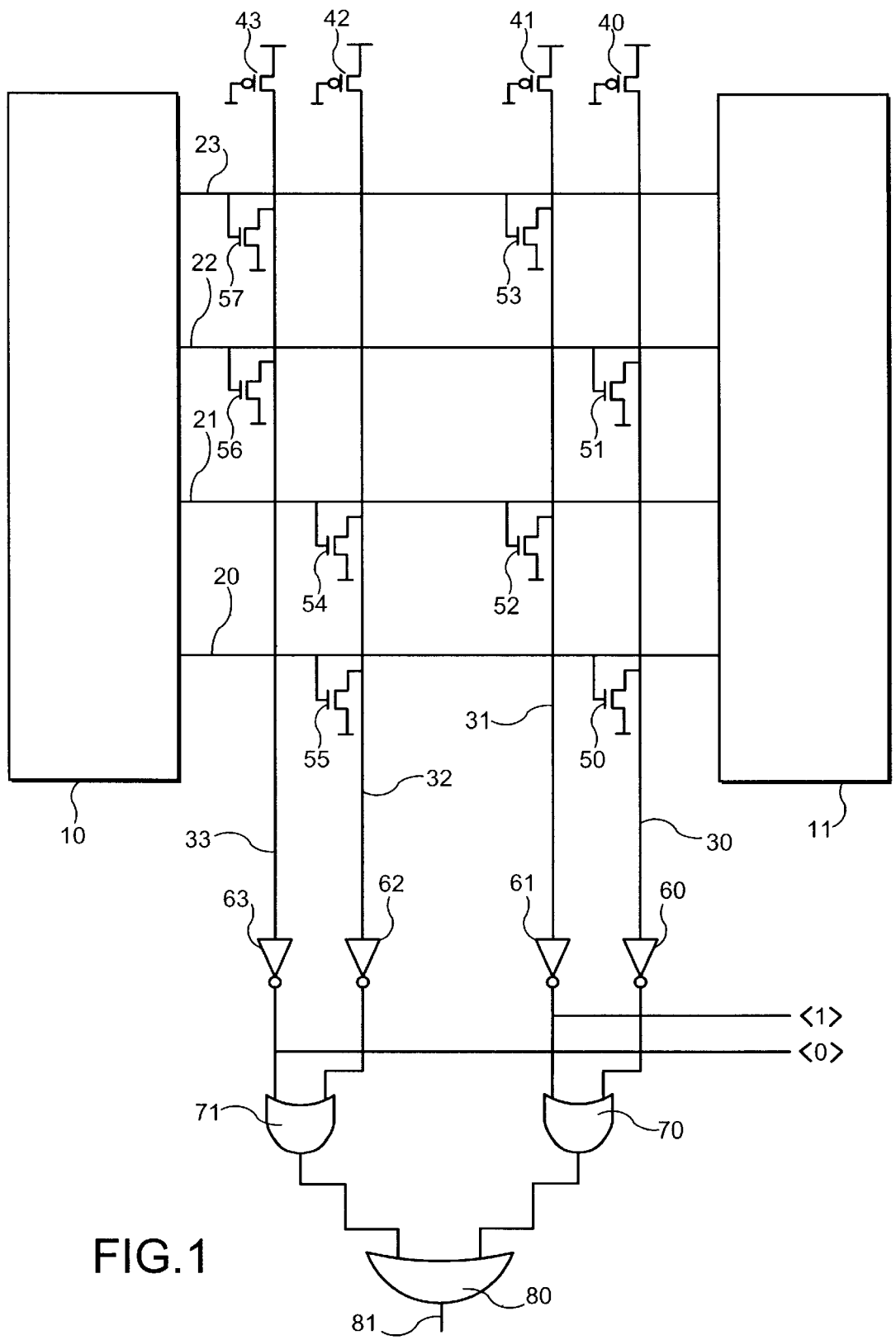
FIG. 1 shows a block schematic diagram of a miss detector in accordance with the present invention, having four output lines.

In the various figures like reference numerals refer to like parts.

Referring first to FIG. 1 a CAM 10 has four output lines 20–23 connecting respective cells of the CAM to a random access memory 11. A miss circuit comprises two pairs of input lines 30,31;32,33. As shown schematically, the input lines 30,31;32,33 run perpendicular to the output lines 20–23. Each of the input lines has a corresponding pull-up p FET 40–43, the pull-up transistors being arranged to conduct. As shown, conduction is ensured by connecting the pull-up transistor gates to earth although it will be clear to those skilled in the art that such a permanent connection is not essential to the performance of the invention. At certain cross points of the output lines of the CAM with the input lines of the detector, switches are provided in the form of pull-down n FETs 50–57 as will later be described.

Each of the individual lines 30,31;32,33 is connected to a respective inverter 60–63. The outputs of the inverters of each bit line pair are connected to the inputs of respective two two-input OR gates 70, 71 and the outputs of the OR gates 70, 71 are connected to a two input output OR gate 80.

In the illustrated embodiment there are four output lines 20–23 and the binary representation of the number four requires two digits. Hence there are two bit line pairs 30,31; 32,33. Of the first bit line pair 30,31 the first bit line 30 is designated as "false" and the second bit line 31 is designated as "true".

Likewise, the second pair 32,33 has a first line 32 which is "false" and a second 33 which is "true". The four output lines 20–23 are designated respectively 0,1,2,3 and connections are made to the corresponding input lines 30–33 according to the binary equivalent of the number of the line. Thus, line 20 designated as "0" (binary equivalent of 0,0) so that this line is connected by pull-down transistors 50 and 55 to the "false" input lines 30,32. Output line 21 is designated as "1" and is thus connected to the true line 31 of the first pair 30,31 by pull-down 52 and to the false line 32 of the second pair 32,33. Similarly line 22 (binary 1,0) is connected to lines 33 and 30, and line 23 (binary 1,1) is connected to lines 33 and 31.

The detector further has register lines 90,91 connected to the outputs of the inverters 61 and 63 respectively of the "true" lines 31,33.

In operation, when the CAM 10 has a hit on, for example, the second line 21 (binary 0,1) input line 32 will be pulled down by the action of transistor 54 and the input line 31 will be pulled down by the action of transistor 52. However, high potentials are applied via the pull-up transistors on lines 30 and 33. The result is that the register lines 90,91 give an output of 01 which corresponds to the binary equivalent of line 21. In this condition, the output OR gate 80 receives a single 1 at each input, and thus produces a logical 1 indicating that the register line output is valid.

If however there are no hits then the fact that each of the output lines is connected to both pairs of input lines of the detector means that inevitably all of the input line pairs will simultaneously produce logic zeros at the inputs to all of the OR gates. This means that no inputs to the OR gates 70, 71 will be at logic 1 giving rise to inputs to the output OR gate 80 of logic 0 and an output from the circuit output 81 of logic 0 indicative that a miss has occurred. In this situation the index outputs (which will be at 0,0) must be disregarded.

Figure 2:
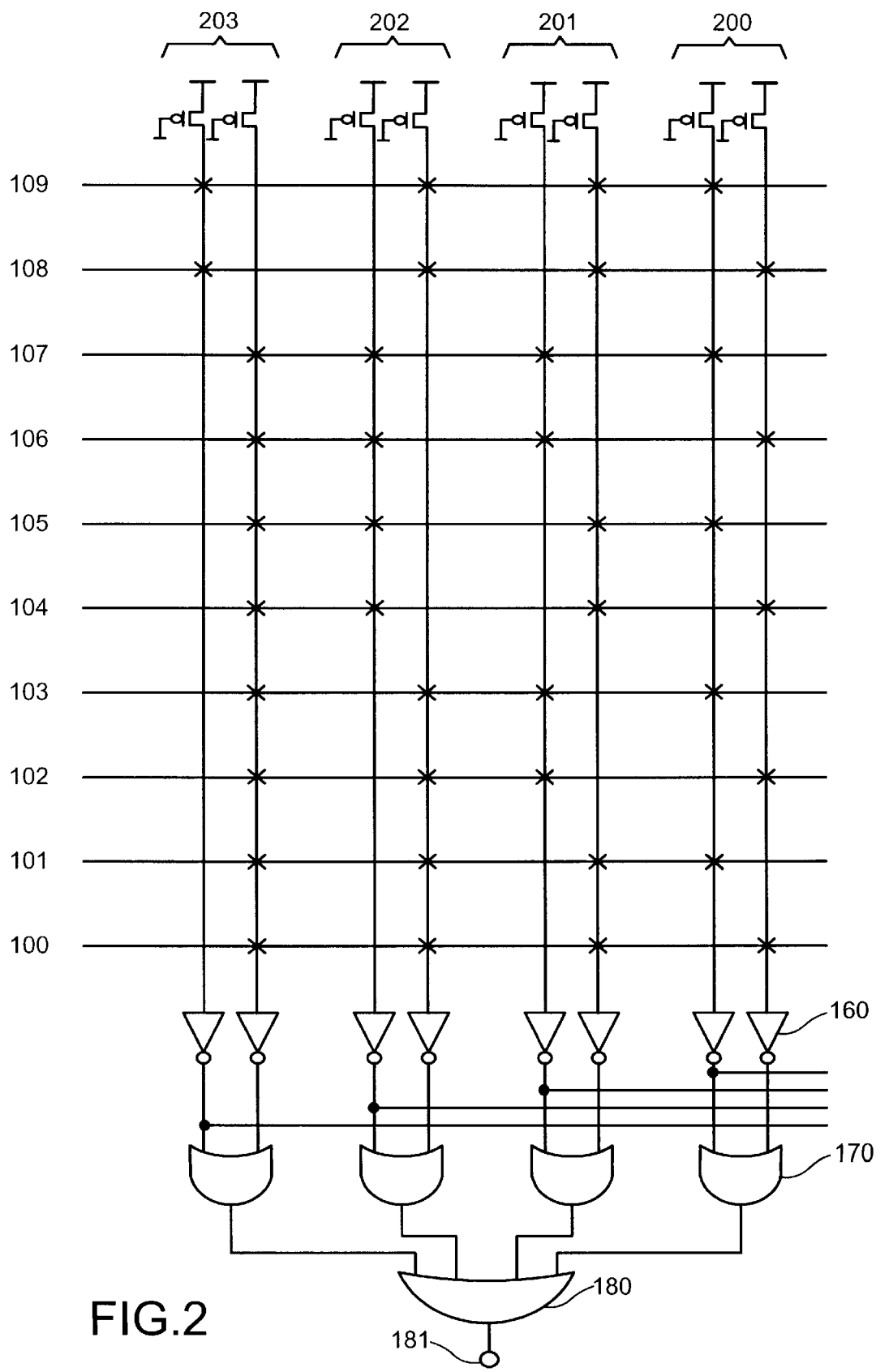
FIG. 2 shows a partial block schematic diagram of a miss detector for a CAM having ten output lines.

Referring now to FIG. 2, the figurative connections are shown between ten input lines 100–109 and the miss detector.

In this case there are four input line pairs 200–203 each comprising a true (left hand) and false (right hand) line. Again, the output lines 100–109 are connected to the input lines at the cross points via pull-down devices such as n FETs and the input lines are pulled up by pull-up devices such as p FETs. The cross point connections are figuratively shown by the symbol "X". It will be seen that line 100 is connected to all of the four false lines (binary 0,0,0,0) whereas for example line 104 is connected to all of the false lines except in the third from right pair 202 (binary 0,1,0,0).

Comparison with FIG. 1 shows that similar inverters 160 are connected to each input line, and that each pair of inverters is connected to a respective two-input OR gate 170. The OR gate outputs are connected to a four-input output OR gate 180 having an output 181 for providing a miss output. The outputs of each true inverter form an index output.

Operation of this circuit is equivalent to that discussed with respect to FIG. 1.

If it is desired to produce an output of logic 1 indicative of a miss, the output or gate 80, 180 is replaced by an equivalent NAND gate.

What is claimed is:

1. A miss detector for a CAM having m output lines for carrying a respective output signal either having a first state indicative of a miss or a second state indicative of a hit, said detector having n pairs of input terminals, wherein the binary equivalent of m has n digits, each input pair comprising a true input terminal and a false input terminal, circuitry connecting each output line to either a true or a false input terminal of every pair, and gating circuitry coupled to each pair, said gating circuitry having an output in a logical state indicative of a miss only when all of said output lines of said CAM have said first state.

2. The miss detector of claim 1 wherein said gating circuitry comprises a two-input OR gate connected to each pair of input terminals.

3. The miss detector of claim 2 wherein said gating circuitry further comprises an n-input output OR gate having an input from each OR gate output.

4. The miss detector of claim 1 wherein said connecting circuitry comprises a respective pull-up device connected to each input terminal and a pull-down device connected to each input terminal wherein said pull-down device has a control terminal connected to said CAM output lines.

5. The miss detector of claim 4 wherein said connecting circuitry further comprises a respective inverter connected between said pull-up/pull-down devices and said input terminals.

6. The miss detector of claim 4 wherein said pull-up device comprises a p FET connected to conduct and said pull-down device comprises plural n FETs, each n FET having a gate connected to a CAM output line.

7. A miss detector for a CAM having m output lines numbered 0 to (m−1), the detector having n pairs of input terminals, each pair comprising a true and a false input terminal, each pair corresponding to a bit position in the binary equivalent of m, connecting circuitry connecting each output line to a true or false input terminal of each pair of input terminals in conformity with the binary equivalent of the number of said output lines, index circuitry coupled to the true input terminals of each pair and having an index output corresponding to the binary equivalent of an output line when a hit occurs on said output line, and gating circuitry having inputs coupled to each pair, said gating circuitry having an output indicative of a miss.

8. The miss detector of claim 7 wherein said gating circuitry comprises a two-input OR gate connected to each pair of input terminals.

9. The miss detector of claim 8 wherein said gating circuitry further comprises an n-input output OR gate having an input from each OR gate output.

10. The miss detector of claim 7 wherein said connecting circuitry comprises a respective pull-up device connected to each input terminal and a pull-down device connected to each input terminal wherein said pull-down device has a control terminal connected to said CAM output lines.

11. The miss detector of claim 10 wherein said connecting circuitry further comprises a respective inverter connected between said pull-up/pull-down devices and said input terminals.

12. The miss detector of claim 10 wherein said pull-up device comprises a p FET connected to conduct and said pull-down device comprises plural n FETs, each n FET having a gate connected to a CAM output line.

13. A miss detector for a content addressable memory (CAM) having m output lines, said detector having n pairs of input terminals, wherein the binary equivalent of m has n digits, each input pair comprising a true input terminal and a false input terminal, circuitry connecting each output line to either a true or a false input terminal of every pair, and gating circuitry coupled to each pair, said gating circuitry having an output indicative of a miss on said output lines of said CAM and wherein said gating circuitry comprising a two-input OR gate connected to each pair of input terminals through an inverter and each output of said two-input OR gate forming the inputs to an n-input OR gate.

14. A miss detector for a content addressable memory (CAM) having m output lines for carrying a respective output signal having either a first state indicative of a miss in the CAM or a second state indicative of a hit in the CAM, the detector comprising:

n pairs of input terminals, wherein a binary equivalent of m has n digits, each pair of input terminals including a true input terminal and a false input terminal;

circuitry connecting each output line to either the true input terminal or the false input terminal of every pair of input terminals; and gating circuitry coupled to each pair of input terminals; wherein the gating circuitry provides an output in a logical state indicative of a miss in the CAM.

* * * * *

UNITED STATES PATENT AND TRADEMARK OFFICE
CERTIFICATE OF CORRECTION

PATENT NO.     : 6,362,991 B1                                              Page 1 of 1
DATED          : March 26, 2002
INVENTOR(S)    : William Bryan Barnes It is certified that error appears in the above-identified patent and that said Letters Patent is hereby corrected as shown below:

Drawings,
Figure 1 should read: --

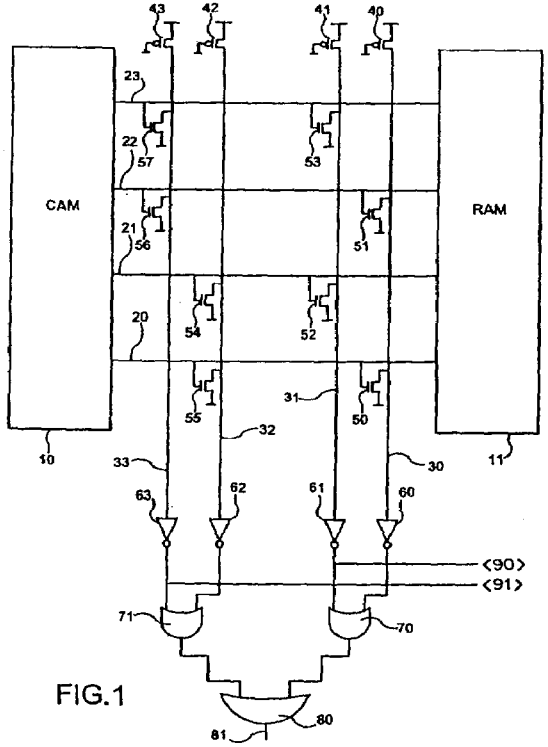

--

Signed and Sealed this

Second Day of July, 2002

Attest:

JAMES E. ROGAN
Attesting Officer          Director of the United States Patent and Trademark Office